US011837996B2

(12) United States Patent
Choi et al.

(10) Patent No.: US 11,837,996 B2
(45) Date of Patent: Dec. 5, 2023

(54) PHASE DEMODULATOR WITH NEGATIVE FEEDBACK LOOP

(71) Applicant: ELECTRONICS AND TELECOMMUNICATIONS RESEARCH INSTITUTE, Daejeon (KR)

(72) Inventors: Jang Hong Choi, Daejeon (KR); Bon Tae Koo, Daejeon (KR); Kyung Hwan Park, Daejeon (KR); Min Park, Daejeon (KR); Seon-Ho Han, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/585,009

(22) Filed: Jan. 26, 2022

(65) Prior Publication Data

US 2022/0302909 A1 Sep. 22, 2022

(30) Foreign Application Priority Data

Mar. 16, 2021 (KR) .......................... 10-2021-0034206

(51) Int. Cl.
*H03D 3/24* (2006.01)
*H03F 3/04* (2006.01)
(Continued)

(52) U.S. Cl.
CPC .............. *H03D 3/247* (2013.01); *H03D 3/02* (2013.01); *H03D 7/00* (2013.01); *H03F 3/04* (2013.01);
(Continued)

(58) Field of Classification Search
CPC .. H03D 3/00; H03D 3/02; H03D 3/06; H03D 11/06; H03D 11/00; H03D 5/00;
(Continued)

(56) References Cited

U.S. PATENT DOCUMENTS

| 4,682,118 A | 7/1987 | Thiel |
| 5,015,962 A * | 5/1991 | Brault ....................... H03D 3/00 329/346 |

(Continued)

FOREIGN PATENT DOCUMENTS

| KR | 10-0354938 B1 | 12/2002 | |
| WO | WO 96/10864 A1 | 4/1996 | |
| WO | WO-0229975 A2 * | 4/2002 | ............... G06F 1/10 |

OTHER PUBLICATIONS

W. Pan et al., "Null point elimination using RF phase shifter in continuous-wave Doppler radar system," Electronic Letters, Oct. 13, 2011, pp. 1-2, vol. 47, No. 21.

*Primary Examiner* — Ryan Johnson

(57) ABSTRACT

Disclosed is a phase demodulator, which includes a transmitter that outputs a reference signal to a target, a receiver that receives a target signal generated in response to the reference signal from the target, and a demodulation processor that demodulates the target signal, and the demodulation processor includes a phase controller that outputs a first phase signal based on the reference signal, a phase shifter that delays a phase of the first phase signal to output a first delayed signal, a mixer that outputs a first mixing signal based on the target signal and the first delay signal, and an amplifier that outputs a first feedback signal generated by amplifying the first mixing signal to the phase controller.

13 Claims, 7 Drawing Sheets

(51) Int. Cl.
*H04L 27/22* (2006.01)
*H03D 7/00* (2006.01)
*H03D 3/02* (2006.01)
*G01S 7/35* (2006.01)
*H03K 5/00* (2006.01)

(52) U.S. Cl.
CPC .............. *H04L 27/22* (2013.01); *G01S 7/354* (2013.01); *G01S 7/358* (2021.05); *H03K 2005/00078* (2013.01); *H03K 2005/00286* (2013.01)

(58) Field of Classification Search
CPC ..... H04L 27/22; H04L 27/227; H04L 27/233; H04L 27/2331; G01S 7/354; G01S 7/358; G01S 7/486; G01S 7/4912; G01S 13/32
See application file for complete search history.

(56) References Cited

U.S. PATENT DOCUMENTS

| | | |
|---|---|---|
| 5,228,043 A | 7/1993 | Naito et al. |
| 5,450,033 A | 9/1995 | Hirabayashi |
| 5,572,164 A * | 11/1996 | Kasperkovitz ......... H03D 3/003 455/337 |
| 8,498,601 B2 | 7/2013 | Horng et al. |
| 2012/0163434 A1 | 6/2012 | Kim et al. |
| 2015/0078279 A1 | 3/2015 | Ko et al. |
| 2020/0150260 A1* | 5/2020 | Lang ....................... G01S 13/42 |

\* cited by examiner

PHASE DEMODULATOR WITH NEGATIVE FEEDBACK LOOP

CROSS-REFERENCE TO RELATED APPLICATIONS

This application claims priority under 35 U.S.C. § 119 to Korean Patent Application No. 10-2021-0034206, filed on Mar. 16, 2021, in the Korean Intellectual Property Office, the disclosures of which are incorporated by reference herein in their entireties.

BACKGROUND

Embodiments of the present disclosure described herein relate to a phase demodulator, and more particularly, relate to a phase demodulator that demodulates a phase through a negative feedback loop.

Continuous Wave (CW) Doppler radars are being used in various applications such as heart rate and respiration measurement, micro vibration measurement, human life detection at disaster sites, and low speed measurement. Although compared to a FMCW (Frequency Modulated Continuous Wave) method and wideband pulse method CW Doppler radars cannot measure distance, it has a relatively simple structure and is being used in various fields. The phase of the CW signal radiated through an antenna is modulated by the movement of a target. By performing coherent demodulation on the modulated phase signal using the radiated CW signal, the speed and phase information of the target are measured.

A typical phase demodulator uses a mixer to generate an in-phase signal and a quadrature-phase signal, and demodulates the phase by amplifying the in-phase signal and the quadrature-phase signal, respectively. The in-phase signal and the quadrature phase signal include a direct current (DC) signal due to a fixed target and an alternating current (AC) signal due to a minute movement of the fixed target, respectively.

In general, DC signals of in-phase signals and quadrature phase signals are 10 to 100 times greater than AC signals. Accordingly, when converting in-phase signals and quadrature phase signals to digital signals without distortion, high-performance dynamic range characteristics of ADC (Analog to Digital Converter) are required.

SUMMARY

Embodiments of the present disclosure provide a phase demodulator that demodulates a phase through a negative feedback loop.

According to an embodiment of the present disclosure, a phase demodulator includes a transmitter that outputs a reference signal to a target, a receiver that receives a target signal generated in response to the reference signal from the target, and a demodulation processor that demodulates the target signal, and the demodulation processor includes a phase controller that outputs a first phase signal based on the reference signal, a phase shifter that delays a phase of the first phase signal to output a first delayed signal, a mixer that outputs a first mixing signal based on the target signal and the first delay signal, and an amplifier that outputs a first feedback signal generated by amplifying the first mixing signal to the phase controller.

According to an embodiment, the phase controller may output the second phase signal based on the first feedback signal, the phase shifter may delay a phase of the second phase signal to output a second delay signal, the mixer may mix the target signal and the second delay signal to generate a second mixing signal, and the amplifier may amplify the second mixing signal and output a second feedback signal to the phase controller.

According to an embodiment, the phase demodulator may further include an output port that outputs a demodulated signal based on the second feedback signal from the amplifier.

According to an embodiment, the phase controller may control the phase of the second phase signal based on a magnitude the first feedback signal and a phase threshold value.

According to an embodiment, the phase controller may lag the phase of the second phase signal when the magnitude of the first feedback signal is greater than the phase threshold value.

According to an embodiment, the phase controller may lag the phase of the second phase signal further as a difference between the first feedback signal and the phase threshold value is greater.

According to an embodiment, the phase controller may lead the phase of the second phase signal when the magnitude of the first feedback signal is less than the phase threshold value.

According to an embodiment, the phase controller may lead the phase of the second phase signal further as a difference between the first feedback signal and the phase threshold value is greater.

According to an embodiment, the phase shifter may delay a phase of the first phase signal by 90 degrees to generate the first delay signal.

According to an embodiment, the mixer may subtract a frequency of the first delay signal from a frequency of the target signal to generate the first mixing signal.

According to an embodiment, the phase controller and the phase shifter may be implemented on one integrated circuit.

According to an embodiment, the phase demodulator may further include a low pass filter connected between the mixer and the amplifier and configured to remove a high frequency band of the first mixing signal.

According to an embodiment of the present disclosure, a method of operating a phase demodulator includes generating a first mixing signal based on a reference signal and a target signal, generating a first feedback signal by amplifying the first mixing signal, generating a delay signal based on the first feedback signal, generating a second mixing signal by mixing the target signal and the delay signal, generating a first feedback signal by amplifying the first mixing signal, and outputting a demodulated signal based on the second feedback signal.

According to an embodiment, the generating of the delay signal based on the first feedback signal may include generating a phase signal based on the first feedback signal and the reference signal, and generating the delay signal by delaying a phase of the phase signal.

According to an embodiment, the target signal and the delay signal may be orthogonal in phase.

According to an embodiment, the generating of the delay signal based on the first feedback signal may further include controlling a phase of the delay signal based on a magnitude of the first feedback signal and a phase threshold value.

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, embodiments of the present disclosure will be described clearly and in detail such that those skilled in the art may easily carry out the present disclosure.

Figure 1:
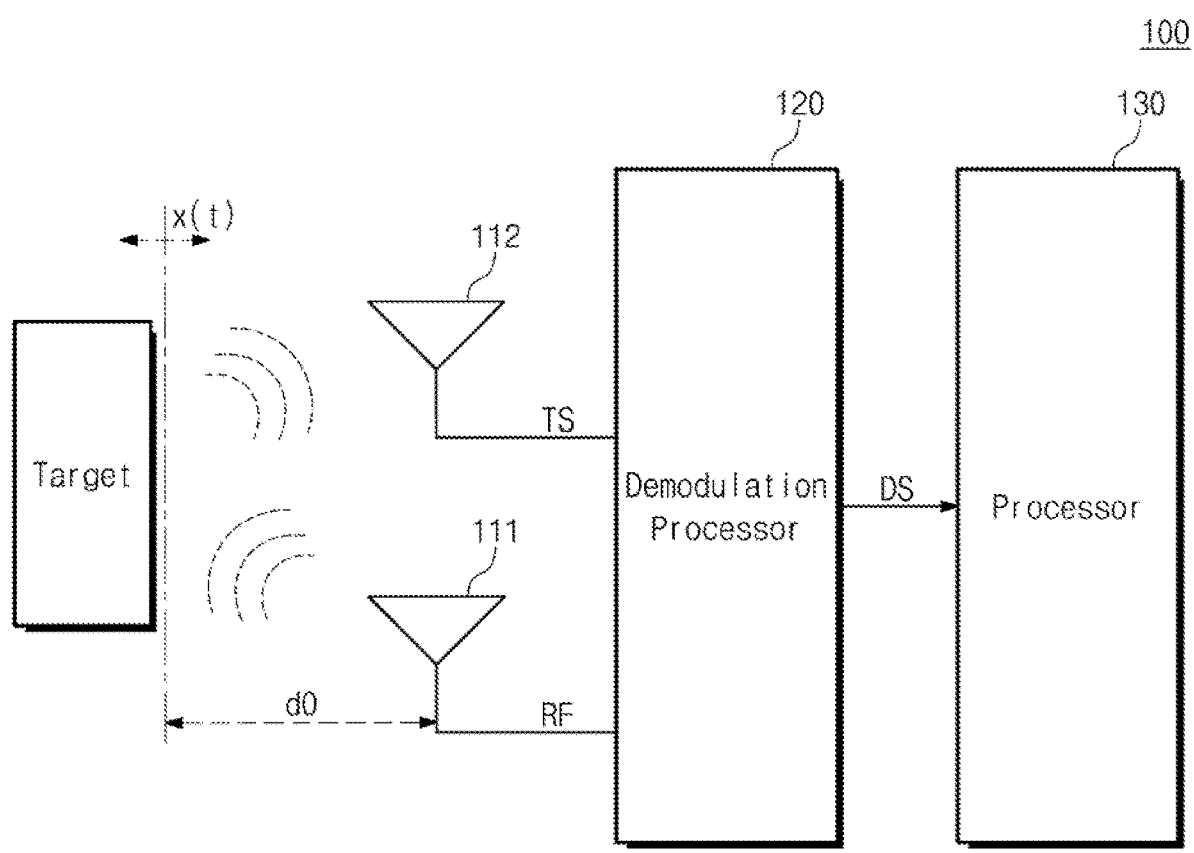
FIG. 1 is a block diagram illustrating a phase demodulator.

FIG. 1 is a block diagram illustrating a phase demodulator according to an embodiment of the present disclosure. Referring to FIG. 1, a phase demodulator 100 is illustrated. The phase demodulator 100 may be a device that demodulates a target signal TS through a negative feedback loop. The negative feedback loop may include a phase controller, a phase shifter, a mixer, and an amplifier. In an embodiment, as the negative feedback loop is repeated, a magnitude of an output signal may converge to a specific range.

For example, the phase demodulator 100 may be used as a device for demodulating a radar signal that may be used for heart rate and respiration measurement, micro vibration measurement, human life detection at disaster sites, low speed measurement, etc.

The phase demodulator 100 may include a transmitter 111, a receiver 112, a demodulation processor 120, and a processor 130.

The transmitter 111 may output a reference signal RF toward a target. In an embodiment, the reference signal RF may be a continuous wave radar (CW radar) signal. The distance between the transmitter 111 and the target may be a reference distance d0.

The receiver 112 may receive the target signal TS from the target. The target signal TS may be a signal output from the target in response to the reference signal RF. For example, the target signal TS may be a signal obtained by reflecting the reference signal RF from the target. The distance between the receiver 112 and the target may be the reference distance d0. While the reference signal RF and the target signal TS are processed, the position of the target may be expressed as the target position x(t). The target position x(t) may mean coordinates at time 't.'

The demodulation processor 120 may demodulate the target signal TS through the negative feedback loop to output a demodulated signal DS. The demodulation processor 120 may output the reference signal RF to the transmitter 111, and may receive the target signal TS from the receiver 112. The demodulation processor 120 may output the demodulated signal DS to the processor 130.

The processor 130 may receive the demodulated signal DS from the demodulation processor 120. The processor 130 may generate information related to the target by using the demodulated signal DS. For example, the processor 130 may process heart rate and respiration measurement, heart rate and respiration measurement, micro vibration measurement, human life detection at disaster sites, etc., based on the demodulated signal DS.

Figure 2:
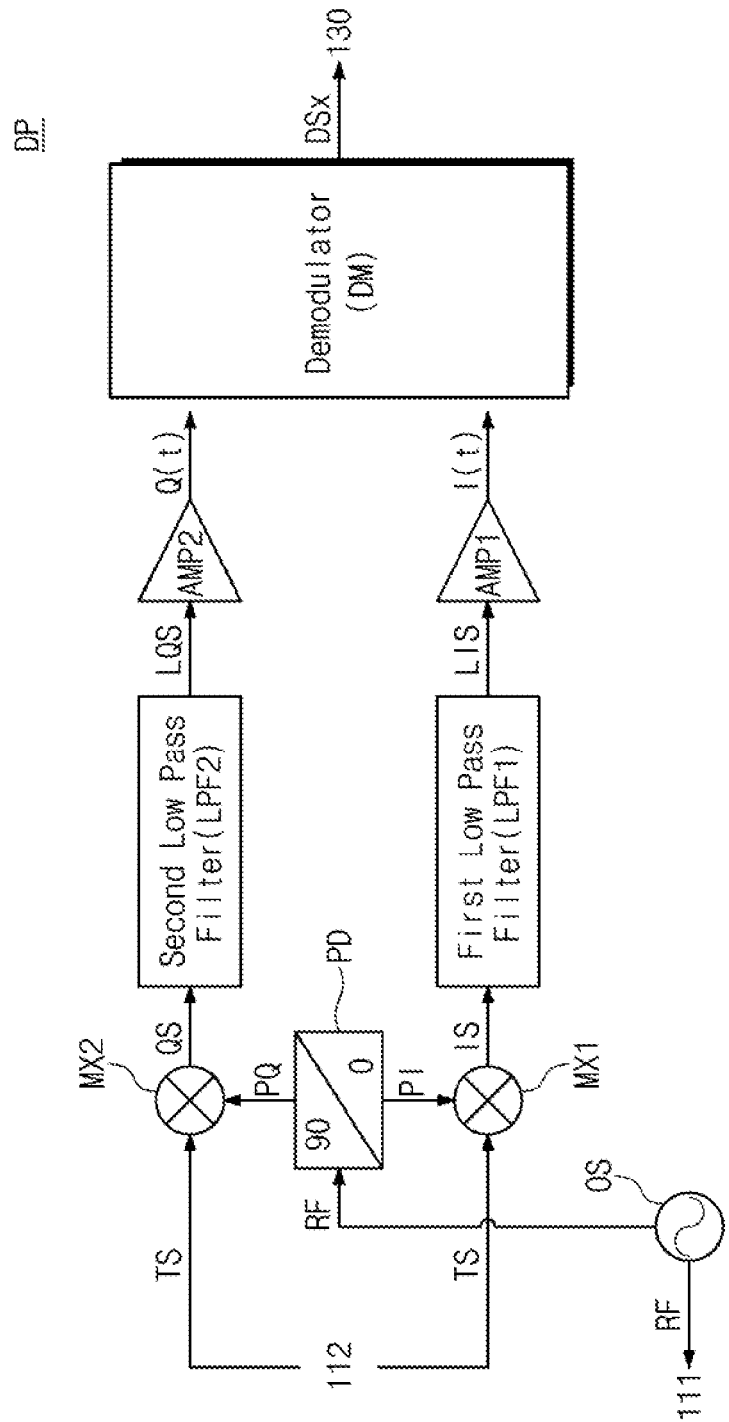
FIG. 2 is a block diagram illustrating a conventional demodulation processor.

FIG. 2 is a diagram illustrating a conventional demodulation processor. Referring to FIG. 2, the demodulation processor DP may generate a demodulated signal DSx by demodulating a phase of the target signal TS. The demodulation processor DP may include a local oscillator OS, a phase separator PD, a first mixer MX1, a second mixer MX2, a first low pass filter LPF1, a second low pass filter LPF2, a first amplifier AMP1, a second amplifier AMP2, and a demodulator DM.

The local oscillator OS may generate the reference signal RF having a reference frequency $f_c$. The reference signal RF will be described with reference to Equation 1 below.

$$T(t)=\cos[2\pi f_c t+\varphi(t)] \quad \text{[Equation 1]}$$

Equation 1 is an equation representing the reference signal RF. Referring to Equation 1, T(t) denotes the reference signal RF, $f_c$ denotes the frequency of the reference signal RF, and $\varphi(t)$ denotes the phase noise of the reference signal RF.

The local oscillator OS may output the reference signal RF to the transmitter 111. The transmitter 111 may output the reference signal RF toward the target. The distance between the transmitter 111 and the target may be the reference distance d0. While the reference signal RF and the target signal TS are processed, the position of the target may be expressed as the target position x(t). The target position x(t) may mean coordinates at time 't.'

The receiver 112 may receive the target signal TS generated in response to the reference signal RF from the target. For example, the target signal TS may be a signal obtained by reflecting the reference signal RF from the target.

The phase separator PD may generate signals PI and PQ based on the reference signal RF. The signal PI may have the same phase as the reference signal RF. The signal PQ may have a phase difference of 90° from the reference signal RF.

The first mixer MX1 may generate a first signal IS based on the target signal TS and the signal PI having the same phase as the reference signal RF. The second mixer MX2 may generate a second signal QS based on the target signal TS and the signal PQ having the phase difference of 90° from the reference signal RF.

The first low pass filter LPF1 may remove the high frequency component of the first signal IS to output a first filter signal LIS to the first amplifier AMP1. The second low pass filter LPF2 may remove the high frequency component of the second signal QS to output a second filter signal LQS to the second amplifier AMP2. The first low pass filter LPF1 and the second low pass filter LPF2 remove high frequency components of the first signal IS and the second signal QS, so that errors due to high frequency noise may decrease during the amplification operation of the first amplifier AMP1 and the second amplifier AMP2.

The first amplifier AMP1 may amplify the first filter signal LIS to generate an in-phase signal I(t). The second amplifier AMP2 may amplify the second filter signal LQS to generate a quadrature phase signal Q(t).

The in-phase signal I(t) and the quadrature phase signal Q(t) will be described with reference to Equation 2 below.

$$I(t)=A_I \cos[\phi(t)]$$

$$Q(t)=A_Q \sin[\phi(t)]$$

Equation 2 represents an in-phase signal and a quadrature phase signal. Referring to Equation 2, $\Phi(t)$ denotes the phases of the in-phase signal I(t) and the quadrature phase signal Q(t). $A_1$ means the magnitude of the in-phase signal I(t), and $A_Q$ means the magnitude of the quadrature phase signal Q(t). Also, Φ(t) will be described with reference to the following Equation 3.

$$\phi(t) = \theta + \frac{4\pi x(t)}{\lambda} + \Delta\varphi(t)$$

Equation 3 is an equation representing the phase of the in-phase signal I(t) and the phase of the quadrature phase signal Q(t). For example, Equation 3 may correspond to the phase of the in-phase signal or the phase of the quadrature phase signal of Equation 2. Referring to Equation 3, Δφ(t) denotes a difference between the phase noise of the reference signal RF and the target signal TS. When the reference distance d0 between the transmitter 111 and the target is not large, Δφ(t) may be ignored due to the effect of a range correlation. θ denotes a phase generated by the reference distance d0 between the transmitter 111 and the target. λ denotes the wavelength of the reference signal RF. Also, x(t) refers to the distance indicated by the movement of the target during a movement time 't'.

Referring to Equations 2 and 3, the in-phase signal I(t), the quadrature phase signal Q(t), and the phases are described. The in-phase signal I(t) and the quadrature phase signal Q(t) may be expressed as a sum of the DC component and the AC component. The DC component may be determined based on θ. The AC component may be determined based on x(t).

In the case of the in-phase signal I(t), the DC component by θ may have a magnitude between $-A_1$ and $+A_1$ based on the reference distance d0 between the transmitter 111 and the target. In the case of the quadrature phase signal Q(t), the DC component by θ may have a magnitude between $-A_Q$ and $+A_Q$ based on the reference distance d0 between the transmitter 111 and the target. Accordingly, to digitally convert the in-phase signal I(t) and the quadrature phase signal Q(t), an ADC (Analog to Digital Converter) capable of processing a signal between $-A_1$ and $+A_1$ and between $-A_Q$ and $+A_Q$ may be required. That is, an ADC with a wide dynamic range may be required.

In an embodiment, the amplifier may have a uniform amplification gain in the unsaturated region and may have a uniform amplitude output in the saturated region. For example, the amplifier may have a uniform amplification gain with respect to an input signal having a magnitude below a saturation threshold. The amplifier may generate an output signal having a uniform magnitude with respect to an input signal having a magnitude greater than or equal to a saturation threshold. The amplifier, the input signal, and the output signal may correspond to the first amplifier AMP1, the first filter signal LIS, and the in-phase signal I(t), respectively, or may correspond to the second amplifier AMP2, the second filter signal LQS, and the quadrature phase signal Q(t), respectively.

In an embodiment, the demodulator DM may generate the demodulated signal DSx based on the in-phase signal I(t) and the quadrature phase signal Q(t). The demodulated signal DSx may be a signal obtained by demodulating the target signal TS.

Figure 3:
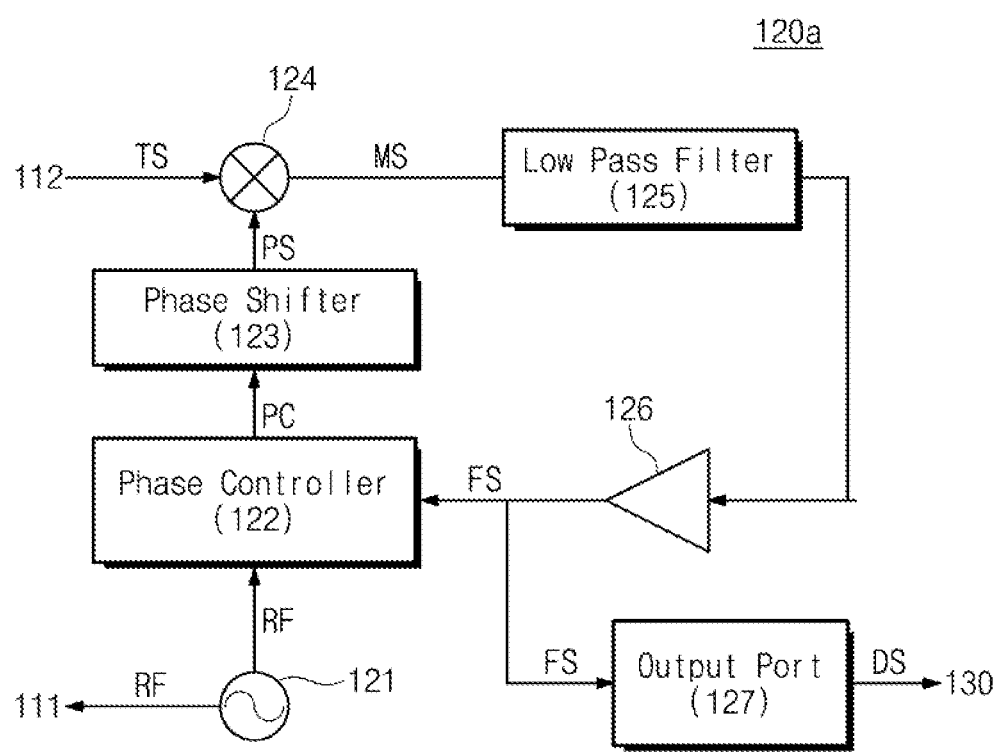
FIG. 3 is a block diagram illustrating a demodulation processor according to an embodiment of the present disclosure.

FIG. 3 is a block diagram illustrating a demodulation processor in FIG. 1. Referring to FIG. 3, a demodulation processor 120a may include a local oscillator 121, a phase controller 122, a phase shifter 123, a mixer 124, a low pass filter 125, an amplifier 126, and an output. port 127. The demodulation processor 120a may demodulate the target signal TS through the negative feedback loop to output the demodulated signal DS.

The local oscillator 121 may generate the reference signal RF having an oscillation frequency. The local oscillator 121 may output the reference signal RF to the transmitter 111 and the phase controller 122.

The phase controller 122 may generate a phase signal PC based on the reference signal RF. The phase controller 122 may output the phase signal PC to the phase shifter 123. The phase controller 122 may generate a signal in which the phase of the reference signal RF is linearly delayed within a range of −180° to 180°. The phase controller 122 may control the phase of the phase signal PC based on the magnitude of a feedback signal FS.

In an embodiment, the phase controller 122 may control the phase of the phase signal PC based on the magnitude of the feedback signal FS and a predetermined phase threshold value. The phase threshold value may be a reference value by which the phase controller 122 lags or leads the phase. For example, when the magnitude of the feedback signal FS is greater than the phase threshold value, the phase controller 122 may lag the phase of the phase signal PC. The phase controller 122 may lead the phase of the phase signal PC when the magnitude of the feedback signal FS is less than the phase threshold value.

In an embodiment, the phase controller 122 may allow the phase signal PC to be lagged further as the difference between the feedback signal FS and the phase threshold increases. In an embodiment, the phase controller 122 may allow the phase signal PC to be led further as the difference between the feedback signal FS and the phase threshold increases.

For example, when the magnitude of the feedback signal FS is '0.1', the phase controller 122 may delay the phase of the phase signal PC by 10°, and when the magnitude of the feedback signal FS is '0.2', the phase controller 122 may delay the phase of the phase signal PC by 20°. However, the present disclosure is not limited thereto, and the phase controller 122 may control the phase of the phase signal PC based on the magnitude of the feedback signal FS according to each embodiment.

The phase shifter 123 may generate a delay signal PS by delaying the phase of the phase signal PC. The phase shifter 123 may output the delay signal PS to the mixer 124. In an embodiment, the phase delay 123 may generate the delay signal PS by delaying the phase of the phase signal PC by 90°.

The mixer 124 may generate the mixing signal MS based on the target signal TS and the delay signal PS. In an embodiment, the mixer 124 may generate the mixing signal MS by subtracting the frequency of the delay signal PS from the frequency of the target signal TS. The mixer 124 may output the mixing signal MS to the amplifier 126. In an embodiment, the mixer 124 may output the mixing signal MS to the low pass filter 125.

The low pass filter 125 may output a signal obtained by removing the high frequency component of the mixing signal MS to the amplifier 126. The low pass filter 125 may be connected between the mixer 124 and the amplifier 126. Since the low pass filter 125 removes the high frequency component of the mixing signal MS, errors due to high frequency noise may decrease during the amplification operation of the amplifier 126.

The amplifier 126 may amplify the mixing signal MS to generate the feedback signal FS. The amplifier 126 may amplify the signal attenuated by path loss to compensate for a signal level. The amplifier 126 may output the feedback signal FS to the phase controller 122 and the output port 127. In an embodiment, the feedback signal FS may have a linear relationship with the phase signal PC.

In an embodiment, the demodulation processor 120a may have a negative feedback loop structure. The negative feedback loop structure may mean a structure in which the feedback signal FS from the amplifier 126 controls the phase controller 122. The negative feedback loop may include the phase controller 122, the phase shifter 123, the mixer 124, and the amplifier 126. In an embodiment, as the feedback signal FS is generated through the negative feedback loop, the phase controller 122 controls the phase of the phase signal PC such that the phase of the phase signal PC and the phase of the target signal TS are the same. In an embodiment, the phase controller 122 may control the phase of the phase signal PC based on the magnitude of the feedback signal FS and a predetermined phase threshold value.

In an embodiment, as the mixing signal MS is generated through the negative feedback loop, the magnitude of the mixing signal MS may converge to a specific range. In an embodiment, when the gain of the amplifier 126 is significantly large (e.g., infinity), the magnitude of the mixing signal MS approaches a specific value (e.g., 0) as the negative feedback loop is repeatedly performed. In an embodiment, when the phase difference between the target signal TS and the delay signal PS approaches 90°, the magnitude of the mixing signal MS may approach a specific value (e.g., 0). For example, the phase of the target signal TS may lead the phase of the delay signal PS, and the phase difference may be close to 90°. In this case, the magnitude of the mixing signal MS may be close to a specific value (e.g., 0).

The output port 127 may output the demodulated signal DS based on the feedback signal FS. In an embodiment, the feedback signal FS and the demodulated signal DS may be signals having the same phase. In an embodiment, when the phases of the target signal TS and the delay signal PS are orthogonal with each other, the demodulated signal DS may be a signal obtained by demodulating the target signal TS. The output port 127 may output the demodulated signal DS to the processor 130.

Figure 4:
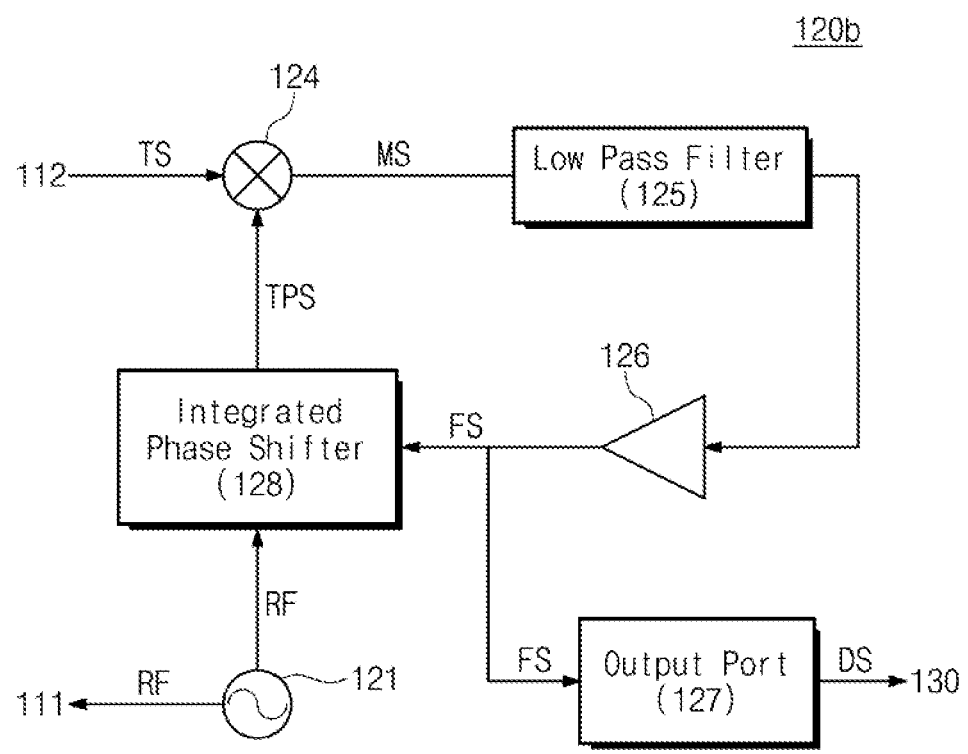
FIG. 4 is a block diagram illustrating a demodulation processor according to an embodiment of the present disclosure.

FIG. 4 is a block diagram illustrating a demodulation processor of FIG. 1 according to an embodiment of the present disclosure. Referring to FIG. 4, a demodulation processor 120b may include the local oscillator 121, an integrated phase shifter 128, the mixer 124, the low pass filter 125, the amplifier 126, and the output. port 127. The demodulation processor 120b may demodulate the target signal TS through the negative feedback loop to output the demodulated signal DS.

Since the local oscillator 121, the mixer 124, the low pass filter 125, the amplifier 126, and the output port 127 of FIG. 4 are similar to the local oscillator 121, the mixer 124, the low pass filter 125, the amplifier 126, and the output port 127 of FIG. 3, respectively, additional description thereof will be omitted to avoid redundancy.

The integrated phase shifter 128 may generate an integrated delay signal TPS by delaying the phase of the phase signal RF. The integrated phase shifter 128 may delay the phase of the reference signal RF based on the feedback signal FS. The integrated phase shifter 128 may output the integrated delay signal TPS to the mixer 124. That is, the integrated phase shifter 128 may be a component in which the phase controller 122 and the phase shifter 123 of FIG. 3 are implemented on one integrated circuit. The integrated delay signal TPS may correspond to the delay signal PS of FIG. 3.

Figure 5:
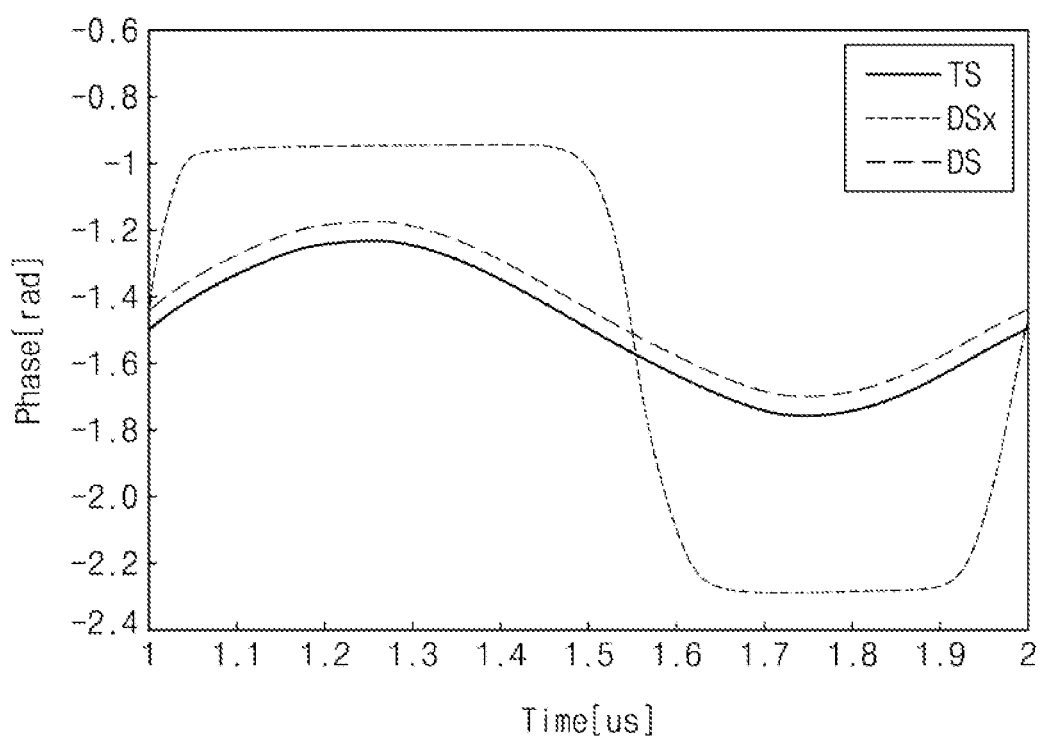
FIG. 5 is a graph illustrating signals demodulated by the present disclosure and the general disclosure.

FIG. 5 is a graph illustrating signals demodulated by the present disclosure and the general disclosure. Referring to FIG. 5, phase changes of the target signal TS, the demodulated signal DSx of the general disclosure, and the demodulated signal DS of the present disclosure are illustrated. A horizontal axis represents a time. A vertical axis represents a phase (radian). The demodulated signal DSx and the demodulated signal DS may be signals obtained by demodulating the target signal TS.

Referring to waveforms of the demodulated signal DSx and the target signal TS, the phase of the demodulated signal DSx may be different from the phase of the target signal TS. That is, the demodulated signal DSx of the general disclosure may be a signal in which the reliability and accuracy of target information are deteriorated as the phase of the target signal TS is distorted.

In contrast, referring to the waveforms of the demodulated signal DS and the target signal TS, the phase of the demodulated signal DS may be similar to the phase of the target signal TS. That is, the demodulated signal DS may be a signal having less distortion or deformation than the demodulated signal DSx, and may be a signal with improved reliability and accuracy associated with target information.

As described above, according to an embodiment of the present disclosure, the demodulated signal DS (e.g., the signal having a waveform similar to the target signal TS) with little distortion or deformation may be obtained by allowing the amplifier in the negative feedback loop to operate in a linear region. Accordingly, a demodulator having improved reliability and accuracy of a demodulation operation may be provided.

Figure 6:
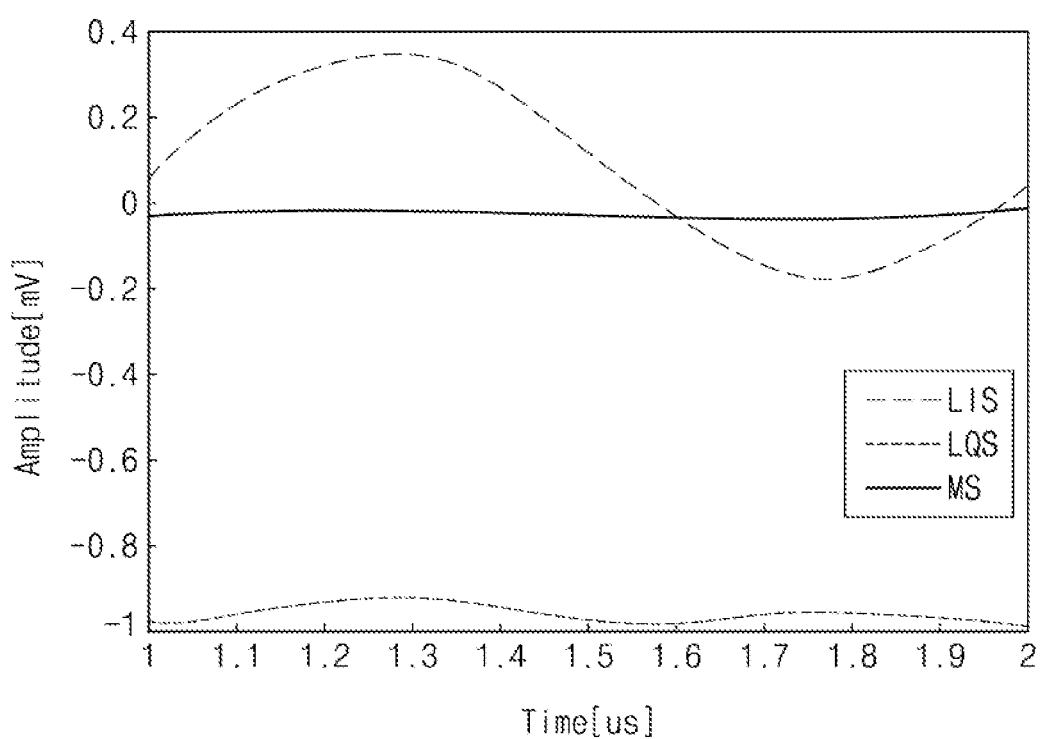
FIG. 6 is a graph illustrating amplifier input signals of the present disclosure and the general disclosure.

FIG. 6 is a graph illustrating amplifier input signals of the present disclosure and the general disclosure. Referring to FIG. 6, the first filter signal LIS, the second filter signal LQS of the general disclosure, and the mixing signal MS of the present disclosure are illustrated. A horizontal axis may represent a time. A vertical axis may represent a voltage. The mixing signal MS, the first filter signal LIS, and the second filter signal LQS are input signals of the amplifier.

In an embodiment, each of the first filter signal LIS and the second filter signal LQS may have a DC component and an AC component. In an embodiment, the first filter signal LIS may correspond to the in-phase signal I(t) of Equation 2. The second filter signal LQS may correspond to the quadrature phase signal Q(t) of Equation 2.

It may be seen that the magnitude of the mixing signal MS of the present disclosure is a fairly small value (e.g., a value divided by a loop gain). When compared with the first filter signal LIS and the second filter signal LQS, the magnitude of the mixing signal MS may be close to a specific value (e.g., '0'). Since the mixing signal MS having a value close to the specific value (e.g., '0') is input to the amplifier through the negative feedback loop, the target signal may be demodulated in a region where the amplifier is not saturated.

As described above, according to an embodiment of the present disclosure, as the target signal is demodulated in the region where the amplifier is not saturated, the demodulated signal DS (e.g., the signal having a waveform similar to the target signal TS) with little distortion or deformation may be obtained. Accordingly, a demodulator having improved reliability and accuracy of a demodulation operation may be provided.

Figure 7:
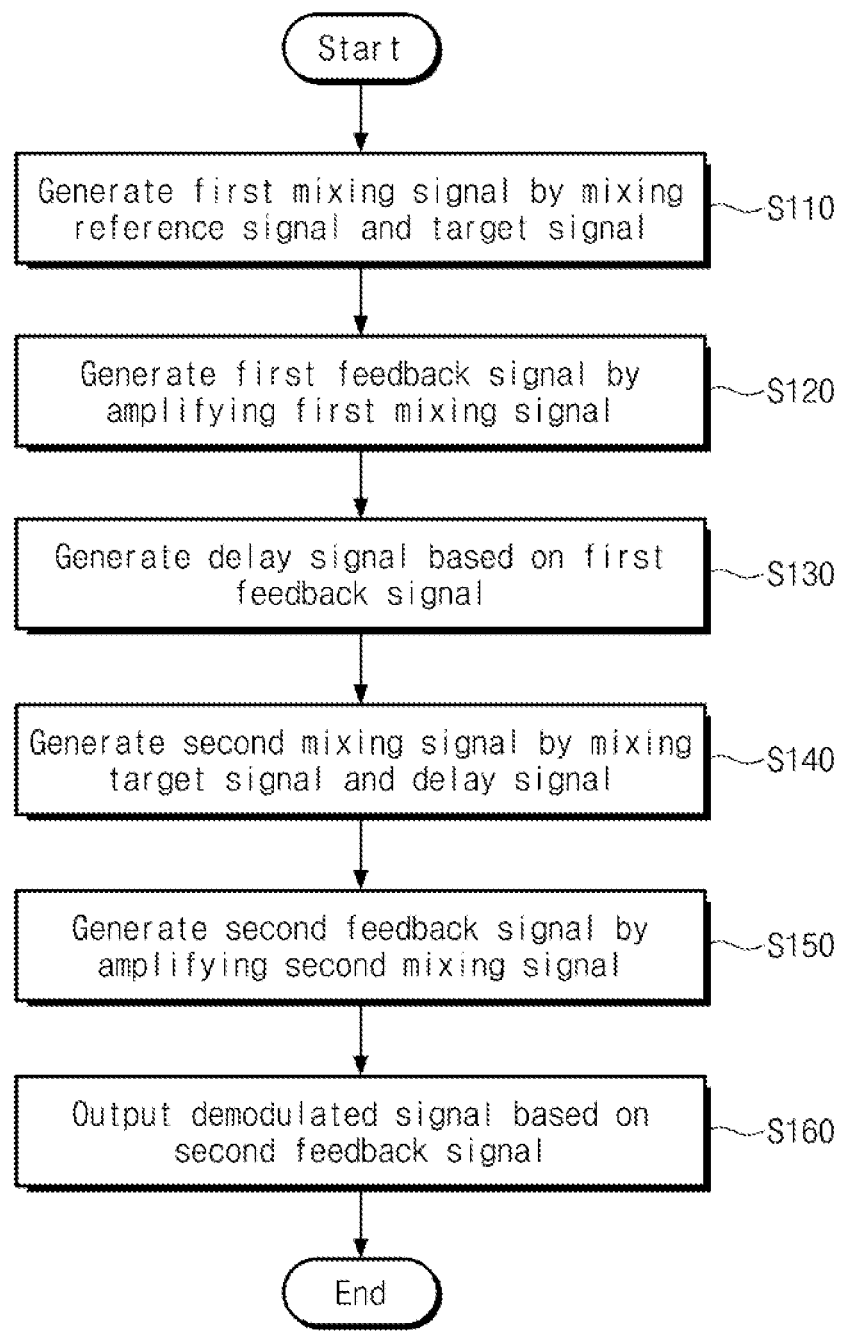
FIG. 7 is a flowchart illustrating an operating method of a demodulation processor according to an embodiment of the present disclosure.

FIG. 7 is a flowchart illustrating an operating method of a demodulation processor according to an embodiment of the present disclosure. Referring to FIG. 7, an operation method of the demodulation processor is illustrated. The demodulation processor may correspond to the demodulation processor of FIG. 3. The demodulation processor may output a demodulated signal by demodulating the target signal through a negative feedback loop structure.

In operation S110, the demodulation processor may generate a first mixing signal by mixing the reference signal and the target signal. In an embodiment, the demodulation processor may generate the first mixing signal by subtracting the frequency of the reference signal from the frequency of the target signal. In an embodiment, the reference signal may be a continuous wave radar (CW radar) signal. The target signal may be a signal generated by the target in response to the reference signal. For example, the target signal may be a signal obtained by reflecting the reference signal to the target.

In operation S120, the demodulation processor may generate a first feedback signal by amplifying the first mixing signal.

In operation S130, the demodulation processor may generate a delay signal based on the first feedback signal. That is, the demodulation processor of the present disclosure may have a negative feedback loop structure such that the first feedback signal generated based on the reference signal is used again to control the reference signal.

In an embodiment, the demodulation processor may generate a phase signal based on the first feedback signal, and may generate a delay signal by delaying the phase of the phase signal. In an embodiment, the demodulation processor may control the phase of the phase signal based on the magnitude of the first feedback signal and the phase threshold value.

In operation S140, the demodulation processor may generate a second mixing signal by mixing the target signal and the delay signal. In this case, the second mixing signal may correspond to the first mixing signal of operation S110, and may be a signal generated later in time than the first mixing signal. For example, the second mixing signal may be a signal generated at the same terminal as a terminal of the first mixing signal, and may be a signal generated in a subsequent loop (i.e., a subsequent cycle) of a loop in which the first mixing signal is generated. In an embodiment, the demodulation processor may generate the second mixing signal by subtracting the frequency of the delay signal from the frequency of the target signal. In an embodiment, the target signal and the delay signal may be orthogonal in phase.

In operation S150, the demodulation processor may generate a second feedback signal by amplifying the second mixing signal. In this case, the second feedback signal may correspond to the first feedback signal of operation S120, and may be a signal generated later in time than the first feedback signal. For example, the second feedback signal may be a signal generated at the same terminal as a terminal of the first feedback signal, and may be a signal generated in a subsequent loop of a loop in which the first feedback signal is generated.

In operation S160, the demodulation processor may output a demodulated signal based on the second feedback signal. In an embodiment, the second feedback signal and the demodulated signal may be signals having the same phase.

According to an embodiment of the present disclosure, a phase demodulator that demodulates a phase through a negative feedback loop is provided.

In addition, there is provided a phase demodulator in which distortion and deformation are reduced by demodulating a target signal in an unsaturated region of the amplifier, and reliability and accuracy of target information are improved.

The above description refers to embodiments for implementing the present disclosure. Embodiments in which a design is changed simply or which are easily changed may be included in the present disclosure as well as an embodiment described above. In addition, technologies that are easily changed and implemented by using the above embodiments may be included in the present disclosure. While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A system comprising a phase demodulator, the system comprising:
   a transmitter configured to output a reference signal to a target;
   a receiver configured to receive a target signal generated in response to the reference signal from the target; and
   a demodulation processor configured to demodulate the target signal,
   wherein the demodulation processor includes:
      a phase controller configured to output a phase signal based on the reference signal and to control a phase of the phase signal based on a magnitude a feedback signal and a phase threshold value;
      a phase shifter configured to delay a phase of the phase signal to output a delay signal;
      a mixer configured to output a mixing signal based on the target signal and the delay signal; and
      an amplifier configured to produce the feedback signal by amplifying the mixing signal.

2. The phase demodulator of claim 1, further comprising:
   an output port configured to output a demodulated signal based on the feedback signal.

3. The phase demodulator of claim 1, wherein the phase controller is further configured to lag the phase of the phase signal when the magnitude of the feedback signal is greater than the phase threshold value.

4. The phase demodulator of claim 3, wherein the phase controller is further configured to lag the phase of the phase signal further as a difference between the feedback signal and the phase threshold value is greater.

5. The phase demodulator of claim 1, wherein the phase controller is further configured to lead the phase of the phase signal when the magnitude of the feedback signal is less than the phase threshold value.

6. The phase demodulator of claim 3, wherein the phase controller is further configured to lead the phase of the phase signal further as a difference between the first feedback signal and the phase threshold value is greater.

7. The phase demodulator of claim 1, wherein the phase shifter is further configured to delay a phase of the phase signal by 90 degrees to generate the delay signal.

8. The phase demodulator of claim 1, wherein the mixer is further configured to subtract a frequency of the delay signal from a frequency of the target signal to generate the mixing signal.

9. The phase demodulator of claim 1, wherein the phase controller and the phase shifter are implemented on one integrated circuit.

10. The phase demodulator of claim 1, further comprising:
a low pass filter connected between the mixer and the amplifier and configured to remove components of high frequency band of the mixing signal before the mixing signal is supplied to the amplifier.

11. A method of operating a phase demodulator, the method comprising:
generating a mixing signal based on a reference signal and a delay signal;
generating a feedback signal by amplifying the mixing signal;
generating the delay signal based on a target signal and the feedback signal, including controlling a phase of the delay signal based on a magnitude of the feedback signal and a phase threshold value; and
outputting a demodulated signal based on the feedback signal.

12. The method of claim 11, wherein generating of the delay signal based on the feedback signal includes:
generating a phase signal based on the feedback signal and the reference signal; and
generating the delay signal by delaying a phase of the phase signal.

13. The method of claim 11, wherein the target signal and the delay signal are orthogonal in phase.

* * * * *